United States Patent [19]
Fujii et al.

[11] Patent Number: 6,048,663
[45] Date of Patent: Apr. 11, 2000

[54] NEGATIVE-WORKING PHOTORESIST COMPOSITIONS AND AND USE THEREOF

[75] Inventors: Hirofumi Fujii; Shunichi Hayashi, both of Osaka, Japan

[73] Assignee: Nitto Denko Corporation, Osaka, Japan

[21] Appl. No.: 09/230,583

[22] PCT Filed: Jul. 28, 1997

[86] PCT No.: PCT/JP97/02605

§ 371 Date: Jan. 29, 1999

§ 102(e) Date: Jan. 29, 1999

[87] PCT Pub. No.: WO98/04959

PCT Pub. Date: Feb. 5, 1998

[30] Foreign Application Priority Data

Jul. 29, 1996 [JP] Japan .................................. 8-198746

[51] Int. Cl.[7] .................................................. G03F 7/004
[52] U.S. Cl. .................................. 430/270.1; 430/283.1; 430/325
[58] Field of Search ........................... 430/325, 270.1, 430/283.1

[56] References Cited

U.S. PATENT DOCUMENTS

| | | | |
|---|---|---|---|
| 5,081,000 | 1/1992 | Kuehn et al. | 430/281 |
| 5,449,584 | 9/1995 | Banba et al. | 430/190 |
| 5,665,523 | 9/1997 | Omote et al. | 430/282.1 |
| 5,851,736 | 12/1998 | Omote et al. | 430/325 |
| 5,858,518 | 1/1999 | Omote et al. | 430/209 |

FOREIGN PATENT DOCUMENTS

| | | | |
|---|---|---|---|
| 5-197148 | 8/1993 | Japan | G03F 7/038 |
| 5-281717 | 10/1993 | Japan . | |
| 6-75376 | 3/1994 | Japan | G03F 7/038 |
| 6-148886 | 5/1994 | Japan . | |
| 7-271034 | 10/1995 | Japan | G03F 7/038 |

*Primary Examiner*—Janet Baxter
*Assistant Examiner*—Rosemary Ashton
*Attorney, Agent, or Firm*—Sughrue, Mion, Zinn, Macpeak & Seas, PLLC

[57] ABSTRACT

A negative-working photoresist composition comprising 1,4-dihydropyridine derivative as a photosensitive material and a polyamic acid, a heat-resisting photoresist composition comprising a photosensitive polyamic acid which is excellent in sensitivity and resolution and can be easily developed with an aqueous alkali solution is provided.

The negative-working photoresist composition contains a polyamic acid and a 1,4-dihydropyridine derivative represented by following formula (I):

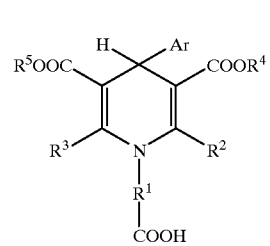

wherein Ar represents an aromatic group having a nitro group at the ortho-position; $R^1$ represents an alkylene group having from 1 to 5 carbon atoms; and $R^2$, $R^3$, $R^4$, and $R^5$ each represents a hydrogen atom or an alkyl group having from 1 to 4 carbon atoms.

4 Claims, No Drawings

NEGATIVE-WORKING PHOTORESIST COMPOSITIONS AND AND USE THEREOF

TECHNICAL FIELD

The present invention relates to a negative-working photoresist composition and the utilizations thereof, and specifically to a negative-working photoresist composition comprising a photosensitive polyamic acid and a method of forming a negative-type pattern and a method of producing a circuit substrate using the composition.

BACKGROUND OF THE INVENTION

Hitherto, a photoresist composition comprising a photosensitive polyimide or a polyamic acid which is a precursor thereof, such a photoresist composition, which has mainly been used practically, is one which is coated on a substrate, light-exposed by the irradiation of an actinic light via a definite photomask, whereby the solubility of the light-exposed portions to a developer is reduced. The unexposed portions are dissolved and removed with the developer to thereby form a desired negative-type pattern on the substrate.

Because in the photoresist composition using photosensitive polyimide or the precursor thereof, which leaves the light-exposed portions with an actinic light on a substrate, the pattern obtained is excellent in the heat resistance, various kinds of the photoresist compositions have hitherto been proposed. For example, a method of introducing a methacryloyl group into the polyimide precursor via an ester bond or an ionic bond (as described in JP-A-49-11541, JP-A-50-40922, JP-A-54-145794, JP-A-56-38038, etc.) (the term "JP-A" as used herein means an "unexamined published Japanese patent application"), a self-sensitizing-type polyimide having a benzophenone skeleton and having an alkyl group at the ortho-position to which a nitrogen atom is bonded (as described in JP-A-59-219330, JP-A-59-231533, etc.), etc., are proposed.

However, in the conventional negative-working photoresist composition comprising such a photosensitive polyimide or the precursor thereof, there are problems that the photoresist film is swelled with a developer at development and the light turns into at the light-exposure using a photomask to cause dissolution residues of the photoresist on the unexposed portions. Also, in the conventional negative-working photoresist composition, the shrinkage percentage of the film at hardening by heating is as large as about 50% and there is also a problem in the dimensional stability of the pattern obtained. Furthermore, because in the conventional photoresist composition, a developer containing an organic solvent is used, there is also a problem in the points of the working environment, the disposal of the waste solution, etc.

In addition, in the latter of the photoresist compositions described above, because the skeleton structure of the polymer is limited, the properties of the film finally obtained are subject to restriction and thus the polyimide cannot flexibly cope with various requirements.

Thus, the present inventors previously solved the above-described various problems in the negative-working photoresist composition comprising the conventional photosensitive polyamic acid by compounding the polyamic acid, which is a polyimide precursor, with a certain kind of a 1,4-dihydroxypyridine derivative forming a base having a pyridine skeleton by the irradiation of an actinic light as a photosensitive agent and clarified that a negative-working photoresist composition having a high sensitivity can be obtained as described in JP-A-6-75376.

However, in the negative-working photoresist composition, because the above-described 1,4-dihydroxypyridine derivative used as the photosensitive agent is insoluble in an aqueous alkali solution, an alcohol/water mixed solution of an alkali substance is used but in this case, depending on the component composition of the developer and the temperature of the development, the crystals of the above-described photosensitive agent sometimes deposit on the substrate during the development. When the crystals of the photosensitive agent deposit on the substrate, the development of a correct pattern is obstructed and also there is a possibility of lowering the resolving property by partially covering the developed fine pattern with the crystals. Furthermore, when the crystals deposited during the development attach to the photoresist film during the development and are still attached after rinsing, the crystals give bad influences on the film characteristics after hardening by heating. Also, in a cleaning process of the production of semiconductors, etc., such crystals cause a factor of lowering the cleaning extent as particles.

The present invention has been made for solving the above-described problems in the conventional negative-working photoresist composition comprising a photosensitive polyamic acid, and an object of the present invention is to provide a heat-resisting negative-working photoresist composition in which the structure of the polyamic acid as a heat-resisting resist-forming substance is not relatively restricted, and which is excellent in the sensitivity and the resolution and can be suitably used for practical production processes.

In particular, the present invention has been made for solving the problems described above in the conventional negative-working photoresist composition comprising a polyamic acid compounded with the above-described 1,4-dihydroxypyridine derivative as the photosensitive agent, and the object of the present invention is to provide a heat-resisting photosesitive composition comprising the photosensitive polyamic acid, which is not only excellent in the sensitivity and the resolution, but also can be easily developed with an aqueous alkali solution.

Furthermore, another object of the present invention is to provide a method of forming a negative-type pattern and a method of producing a circuit substrate using the above-described photoresist composition.

DISCLOSURE OF THE INVENTION

The negative-working photoresist composition of the present invention comprises a polyamic acid and a 1,4-dihydropyridine derivative represented by following formula (I)

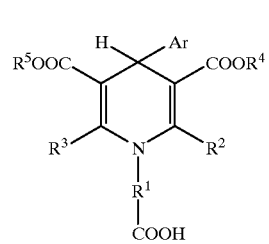

wherein Ar represents an aromatic group having a nitro group at the ortho-position; $R^1$ represents an alkylene group having from 1 to 5 carbon atoms; and $R^2$, $R^3$, $R^4$, and $R^5$ each represents a hydrogen atom or an alkyl group having from 1 to 4 carbon atoms.

The method of forming a negative-type pattern of the present invention comprises coating the above-described negative-working photoresist composition on a substrate, drying, light-exposing the coated film by irradiating an actinic light via a photomask, heating the coated film to the temperature range of from 120° C. to 200° C., and then developing the film with an alkaline developer to dissolve and remove the unexposed portions of the coated film.

In particular, after forming the negative-type pattern according to the present invention as described above, the negative-type pattern is heated to a temperature of 300° C. or higher to form a polyimide from the polyamic acid, whereby a heat-resisting negative-type pattern composed of a polyimide resin can be formed.

Furthermore, according to the present invention, the above-described negative-working photoresist composition is coated on a metal foil substrate, dried, exposed by irradiation of an actinic light via a photomask, heated to the temperature range of from 120° C. to 200° C. and then developed with an alkaline developer so that the unexposed portions of the film are dissolved and removed to thereby form a negative-type pattern, and the negative-type pattern is heated to a temperature of 300° C. or higher to form a polyimide from the polyamic acid. Thus, a circuit substrate having a heat-resisting negative-type pattern composed of a polyimide resin as an insulating layer can be obtained.

BEST MODES FOR CONDUCTING THE INVENTION

The negative-working photoresist composition contains a polyamic acid and the 1,4-dihydropyridine derivative represented by the above-described formula (I). As the above-described polyamic acid, there is no particular restriction if the polyamic acid is known to form a polyimide by heating, but the polyamic acid usually has a structural unit represented by following formula (II):

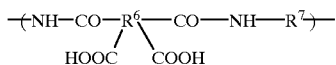

(II)

wherein $R^6$ represents a tetravalent hydrocarbon group and $R^7$ represents a divalent hydrocarbon group.

In the above-described structural unit, examples of $R^6$ which is a tetravalent group include aromatic, aliphatic or alicyclic hydrocarbon tetravalent groups each having the skeleton of benzene, naphthalene, perylene, diphenyl, diphenyl ether, diphenyl sulfone, diphenyl propane, diphenyl hexafluoropropane, benzophenone, butane, cyclobutane, etc. In these groups, the tetravalent groups each having the skeleton of benzene, diphenyl, diphenyl hexafluoropropane, or benzophenone are particularly preferred. However, the hexavalent hydrocarbon groups are not limited to them.

Also, in the above-described structural unit, examples of $R^7$ which is a divalent hydrocarbon group include aromatic, aliphatic or alicyclic hydrocarbon divalent groups each having the skeleton of diphenyl ether, benzophenone, diphenylmethane, diphenylpropane, diphenyl hexafluoropropane, diphenyl sulfoxide, diphenyl sulfone, biphenyl, benzene, diphenoxybenzene, etc. In these divalent hydrocarbon groups, the divalent groups each having the skeleton of diphenyl ether, benzene, or diphenoxybenzene are particularly preferred. However, the divalent hydrocarbon groups are not limited to them.

The polyamic acid having the above-described structural unit can be obtained by reacting a tetracarboxylic acid anhydride having the above-described tetravalent group as the skeleton and an almost equimolar amount of a diamine having the above-described divalent group in an appropriate organic solvent such as N-methyl-2-pyrrolidone, dimethyl acetamide, dimethyl formamide, dimethyl sulfoxide, hexamethyl phosphoramide, etc.

Also, in the 1,4-dihydropyridine derivative represented by the above-described formula (I), Ar represents an aromatic group having a nitro group at the ortho-position and preferably represents an o-nitrophenyl group; $R^1$ represents an alkylene group having from 1 to 5 carbon atoms, preferably a methylene group, an ethylene group or a propylene group: and $R^2$, $R^3$, $R^4$, and $R^5$ each represents a hydrogen atom or an alkyl group having from 1 to 4 carbon atoms, preferably a hydrogen atom, a methyl group or an ethyl group.

Accordingly, in the present invention, preferred examples of the 1,4-dihydropyridine derivative represented by the above-described formula (I) include 1-carboxypropyl-3,5-methoxycarbonyl-4-(2-nitrophenyl)-1,4-dihydropyridine, 1-carboxymethyl-2,6-dimethyl-3,5-methoxycarbonyl-4-(2-nitrophenyl)-1,4-dihydropyridine, and 1-carboxymethyl-3,5-ethoxycarbonyl-4-(2-nitrophenyl)-1,4-dihydropyridine.

Such a 1,4-dihydropyridine derivative can be obtained, for example, by reacting a substituted benzaldehyde, an alkyl propiolate (propargylic acid alkyl ester) in an amount of the two times molar amount thereof, and a corresponding primary amine in glacial acetic acid under refluxing (*Khim. Geterotsikl. Soed.*, pp. 1067–1071, 1982) or by introducing an ester group into a corresponding 1,4-dihydropyridine derivative such as 4-o-nitrophenyl-3,5-dimethoxycarbonyl-2,6-dimethyl-1,4-dihydropyridine (nifedipine), etc., by an N-alkylation and a selective hydrolysis thereof.

According to the present invention, the 1,4-dihydropyridine derivative is compounded with the above-described polyamic acid in the range of usually from 5 to 50 parts by weight, and preferably from 10 to 30 parts by weight to 100 parts by weight of the polyamic acid. If the compounded amount of the 1,4-dihydropyridine derivative is less than 5 parts by weight to 100 parts by weight of the above-described polyamic acid, when the photoresist composition obtained is irradiated with an actinic light, the reducing effect of the solubility of the light-exposed portions to an alkaline developer is poor, thereby the pattern formed by development is liable to become indistinct. On the other hand, if the compounding amount of the 1,4-dihydropyridine derivative is more than 50 parts by weight, when the photoresist composition is stored as a solution thereof, solid components deposit to give bad influences on the storing property and the pattern forming property, and further when a heat-treatment is applied after forming a negative-type pattern, the weight loss of the film is large to lower sometimes the mechanical strength.

The photoresist composition of the present invention is coated on an appropriate substrate, dried, exposed by irradiating an actinic light via a photomask, and heated (heating after light-exposure) to form a negative-type latent image, and the latent image is developed to provide a negative-type image, that is, a desired pattern. Then, the pattern is finally heated to a high temperature to form a polyimide from the polyamic acid to obtain a pattern image composed of a polyimide resin. As the actinic light described above, ultra-violet rays are usually preferably used.

In more detail, although there is some difference depending on the kind of the photosensitive agent used, by carrying out heating after light-exposure at a temperature of about 150° C. or higher, the solubility of the light-exposed portions to a developer composed of an aqueous alkali solution is reduced to increase relatively the solubility of the unexposed portions to the developer, whereby a negative-type image can be formed by development.

The reason why the solubility of the light-exposed portions to an alkaline developer is reduced by light-exposing the photoresist composition of the present invention as described above is considered to be that the above-described 1,4-dihydropyridine derivative is converted into a pyridine derivative, a quaternary ammonium hydroxide derivative, etc., through an intramolecular rearrangement and further a chemical reaction proceeds by the subsequent heat treatment, whereby a some interaction occurs between the converted derivative and the above-described polyamic acid to lower the alkali solubility of the polyamic acid and the negative-type pattern is formed.

Furthermore, according to the present invention, a dissolution accelerator of the unexposed portions of the photoresist film can be incorporated into the photoresist composition. The dissolution accelerator includes aromatic aldehydes such as nitrobenzaldehydes, dinitrobenzaldehydes, cyanobenzaldehydes, and isophthalaldehydes, and high-boiling aliphatic aldehydes such as glyoxal. In these compounds, o-, m-, or p-nitrobenzaldehyde is particularly preferred. These compounds are used singly or as a mixture of two or more kinds thereof. The dissolution accelerator is used usually in the range of from 1.5 to 20 parts by weight to 100 parts of the polyamic acid (solid component). If the compounding amount of the dissolution accelerator to the photoresist composition is too large, the polyimide resin film sometimes becomes inferior in the physical properties and the polyimide resin film sometimes causes cracks after heating after light exposure, at development, at drying after development, at high-temperature heating, etc.

The photoresist composition of the present invention can be obtained, for example, by preparing a polyamic acid from a tetracarboxylic acid dianhydride and a diamine in an appropriate organic solvent as described above and thereafter compounding the polyamic acid with the above-described 1,4-dihydropyridine derivative and, if necessary, the above-described dissolution accelerator.

According to the present invention, after coating the photoresist composition on an appropriate substrate at a dry thickness of from 1 to 50 μm, and preferably from 10 to 30 μm, the coated film is dried by heating to the temperature range of from 50° C. to 100° C., then the coated film is light-exposed by irradiating an actinic light through a suitable photomask according to a desired pattern, and thereafter, after heating the coated film (heating after light exposure) to the temperature range of from 120° C. to 200° C., and preferably from 130° C. to 180° C., the coated film is subjected to a development processing with a developer using a dipping method or a spraying method to remove the unexposed portions, whereby a negative-type pattern can be obtained. There is no particular restriction on the heating time after the light-exposure, but the heating time is usually from several minutes to several tens minutes.

In the present invention, as the above-described developer, an aqueous solution of an inorganic alkali such as sodium hydroxide and potassium hydroxide can be used. However, if necessary, an organic alkaline aqueous solution of propylamine, butylamine, monoethanolamine, tetramethylammonium hydroxide, choline and the like can be also used. Furthermore, the alkaline aqueous solution may further contain an organic solvent such as alcohols, and various surface active agents. According to the present invention, by using the developer as described above, the unexposed portions of the photoresist film can be completely dissolved off within a practical time. As described above, after light-exposing the photoresist film and developing the film, by washing the film with water, a resin coating having a desired negative-type pattern can be obtained.

Finally, by heating the resin coating to a high temperature of from 300° C. to 500° C., the polyamic acid causes a cyclodehydration to form a polyimide and a negative image composed of a polyimide resin having a heat resistance can be obtained. There is no particular restriction on the heating time if the above-described purpose is attained, but usually heating is carried out for about several hours.

Accordingly, the photoresist composition of the present invention is coated on a proper metal foil substrate made of copper, aluminum, etc., dried, light-exposed by the irradiation of an actinic light via a photomask, heated to the temperature range of from 120° C. to 200° C., and developed with an alkaline developer to dissolve and remve the unexposed portions to form a negative-type pattern. The negative pattern is heated to a temperature of 300° C. or higher to form a polyimide from the polyamic acid. Thus, a circuit substrate having a polyimide resin layer composed of a desired pattern as an insulating layer can be obtained. More concretely, the insulating layer composed of the polyimide resin is formed on the metal foil substrate as described above and then by forming a definite pattern circuit composed of an electrically conductive layer on the insulating layer, for example, a circuit-attached suspension substrate can be obtained.

The present invention is described more practically by referring to the following examples and the reference examples but the present invention is not limited to these examples.

REFERENCE EXAMPLE 1

Synthesis of 1-carboxypropyl-3,5-dimethoxycarbonyl-4-(2-nitropheyl)-1,4-dihydropyridine In 20 g of acetic acid were dissolved 7.56 g (0.05 mol) of o-nitrobenzaldehyde and 7.73 g (0.075 mol) of aminoacetic acid. The solution was heated on an oil bath to a temperature of 100° C. and while stirring the solution, 8.41 g (0.10 mol) of methyl propionate was added dropwise to the solution over a period of 1 hour. Thereafter, after heating the mixture with stirring for 30 minutes, the mixture was cooled to room temperature. After cooling, 200 ml of chloroform was added to the mixture to dissolve the reaction product formed and after washing the solution 2 times with 100 ml of an aqueous 10% acetic acid solution and 3 times with water, the organic layer formed was collected and dried with anhydrous magnesium sulfate.

Thereafter, anhydrous magnesium sulfate was removed from the solution by filtration and the filtrate obtained was concentrated under reduced pressure. To the concentrated residue was added a small amount of methanol, followed by dissolving the residue, the solution obtained was cooled in a refrigerator. Crystals thus deposited were collected by filtration, washed with cold methanol, and dried under a reduced pressure. Furthermore, the crystals obtained were recrystallized from water/methanol (1/2). The amount of the crystals of the product was 9.53 g (yield 47%)

Elemental Analysis (%)

|  | H | C | N |
|---|---|---|---|
| Calculated | 4.99 | 56.43 | 6.93 |
| Found | 5.06 | 56.03 | 6.75 |

Mass Spectrum:
m/z: $(M+H)^+ = 405$
Proton Nuclear Resonance Spectra (SMSO-$d_6$, δ(ppm)):
Shown in Table 1 below:

TABLE 1

| Belonging | δ (ppm) | Signal | Proton no. |
|---|---|---|---|
| N—$CH_2CH_2CH_2CO_2H$ | 1.85 | m | 2 |
| N—$CH_2CH_2CH_2CO_2H$ | 2.28 | m | 2 |
| —$COOCH_3$ | 3.49 | s | 6 |
| N-$CH_2CH_2CH_2CO_2H$ | 3.57 | m | 2 |
| H—(dihydropyridine ring) | 5.60 | s | 1 |
| H (aromatic, nitrophenol) | 7.38 / 7.43 / 7.46 | m / s / d | 4 |
| H (aromatic) | 7.61 | m | 1 |
| H (aromatic) | 7.78 | m | 1 |
| —COO$H$ | 12.21 | s | 1 |

EXAMPLE 1

In N-methyl-2-pyrrolidone were dissolved pyromellitic acid anhydride and an almost equivalent molar amount of 4,4'-diaminodiphenyl ether such that the total concentration of the monomer became 15% by weight and they were reacted at room temperature for 24 hours to provide a solution of a polyamic acid. After diluting the solution with N-methyl-2-pyrrolidone, to 100 parts by weight of the polyamic acid (solid component) were added 15 parts by wight of 1-carboxypropyl-3,5-dimethoxycarbonyl-4-(2-nitrophenol)-1,4-dihydropyridine (hereinafter, is referred to as NCP) and 7.5 parts by weight of o-nitrobenzaldehyde (dissolution accelerator), followed by uniformly dissolving, to provide a photoresist composition.

The photoresist composition was coated on a silicon wafer using a spin coater and pre-dried in an oven of 80° C. for 20 minutes to obtain a coated film having a dry thickness of about 15 μm. Thereafter, a contact light-exposure was applied through a glass mask for 30 seconds using a super high-pressure mercury lamp of 250 W.

After the light-exposure, the coated film was heated by a hot plate of 135° C. for 3 minutes, after developing the coated film using an aqueous solution of tetramethylammonium hydroxide having a concentration of 2.38% by weight as a developer to dissolve and remove the unexposed portions of the photoresist film, the substrate having thereon the undissolved photoresist film pattern was rinsed with water to obtain a good negative-type pattern that the exposed portions of the photoresist film only clearly remained on the substrate. During the development, the deposition of crystals was not occurred and after rinsing, particles deposited on the surface of the developed film were not observed. The residual film ratio after development was 90%.

EXAMPLE 2

By following the same procedure as Example 1 except that a solution of a polyamic acid was prepared from biphenyltetracarboxylic acid anhydride and m-phenylenediamine (total monomer concentration: 20%) in N-methyl-2-pyrrolidone and after light-exposure, the coated film of the photoresist composition on the substrate was heated to 150° C. for 3 minutes, a negative-type pattern was obtained. Then, by treating the negative-type pattern obtained as in Example 1, a good pattern was obtained.

EXAMPLE 3

By following the same procedure as Example 2 except that dimethylacetamide was used as the organic solvent, a negative-type pattern was obtained. By treating the negative-type pattern as in Example 1, a good pattern was obtained.

EXAMPLE 4

By following the same procedure as Example 1 except that a solution of a polyamic acid was prepared from a mixture of pyromellitic acid anhydride and biphenyltetracarboxylic acid anhydride (1:1 mole ratio) and diaminodiphenyl ether, a negative-type pattern was obtained. By treating the negative-type pattern as in Example 1, a good pattern was obtained.

EXAMPLE 5

By following the same procedure as Example 1 except that a solution of a polyamic acid was prepared from a mixture of pyromellitic acid anhydride and benzophenone tetracarboxylic acid anhydride (1:1 mole ratio) and diaminodiphenyl ether, and after diluting the solution of the polyamic acid solution with N-methyl-2-pyrrolidone, 15 parts by weight of NCP and 4 parts by weight of o-nitrobenzaldehyde (dissolution accelerator) were added to the solution to 100 parts of the polyamic acid (solid component) followed by uniformly dissolving to obtain a photoresist composition.

The photoresist composition was coated on a silicon wafer using a spin coater and pre-dried in an oven of 80° C. for 20 minutes to obtain a coated film having a dry thickness of about 15 μm. Thereafter, the coated film was subjected to a contact light-exposure by a super high-pressure mercury lamp of 250 W for 30 seconds through a glass mask.

After the light-exposure, the silicon wafer having thereon the coated film of the photoresist composition thus light-exposed was heated by a hot plate of 140° C. for 2.5 minutes and thereafter was treated as in Example 1 to obtain a good negative-type pattern. The residual film rate at development was 90%.

Furthermore, when the pattern was heated in a nitrogen gas atmosphere to 400° C. for 1 hour to form a polyimide from the polyamic acid, the residual ratio of the film was about 70% of that before hardening by heating.

The polyimide resin film finally obtained as described above was brown and transparent, had an elongation of at least 20%, and sufficiently equipped with the practical various characteristics such as the mechanical strength, the electric characteristics, and the heat resistance.

COMPARATIVE EXAMPLE 1

By following the same procedure as Example 1 except that 4-o-nitrophenyl-3,5-dimethoxycarbonyl-2,6-dimethyl-1-methyl-1,4-dihydropyridine was used in place of NCP, a negative-type pattern was formed. In this case, however, during the development, crystals which were considered to be those of the above-described compound deposited and covered the fine pattern formed, etc., whereby a uniform pattern could not obtained and further the crystals during the development re-attached to the surface of the film and partially remained on the surface after rinsing. Also, the developer used became white-turbid with the continue of the development.

INDUSTRIAL APPLICATION FIELD

As described above, according to the photoresist composition of the present invention, a negative-type pattern having a high sensitivity and a high resolution can be formed and further an aqueous alkali solution can be used as the developer. Furthermore, because the negative-type pattern composed of a polyimide resin finally obtained using the photoresist composition of the present invention is excellent in the heat resistance as well as in the electric characteristics and the mechanical characteristics, the photoresist composition of the present invention can be suitably used as a material for forming a solid element in semiconductor industries and a protection or insulating film for a circuit substrate.

What is claimed is:

1. A negative-working photoresist composition comprising a polyamic acid and a 1,4-dihydropyridine derivative represented by following formula (I):

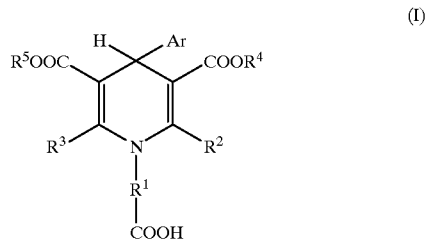

wherein Ar represents an aromatic group having a nitro group at the ortho-position; $R^1$ represent an alkylene group having from 1 to 5 carbon atoms; and $R^2$, $R^3$, $R^4$, and $R^5$ each represents a hydrogen atom or an alkyl group having from 1 to 4 carbon atoms.

2. A method of forming a negative-type pattern, which comprises coating a negative-working photoresist composition as described in claim 1 on a substrate, drying, light-exposing the coated film by irradiating an actinic light via a photomask, heating the coated film to the temperature range of from 120° C. to 200° C., and then developing the coated film with an alkaline developer to dissolve and remove the unexposed portions.

3. A method of forming a heat-resisting negative-type pattern, which comprises coating a negative-working photoresist composition as described in claim 1 on a substrate, drying, light-exposing the coated film by irradiating an actinic light via a photomask, heating the coated film to the temperature range of from 120° C. to 200° C., developing the coated film thus heated with an alkaline developer to dissolve and remove the unexposed portions, thereby forming a negative-type pattern, and then heating the negative-type pattern formed to a temperature of 300° C. or higher to form a polyimide from the polyamic acid.

4. A method of forming a circuit substrate, which comprises coating a negative-working photoresist composition as described in claim 1 on a metal foil substrate, drying, light-exposing the coated film by irradiating an actinic light via a photomask, heating the coated film to the temperature range of from 120° C. to 200° C., developing the coated film with an alkaline developer to dissolve and remove the unexposed portions, thereby forming a negative-type pattern, and then heating the negative-type pattern formed to a temperature of 300° C. or higher to form a polyimide from the polyamic acid as an insulating layer.

* * * * *